(12) United States Patent
Tiziani et al.

(10) Patent No.: US 6,195,256 B1
(45) Date of Patent: Feb. 27, 2001

(54) CARD ASSEMBLY OF POWER DEVICE IN PLASTIC PACKAGE WITH EXTERNAL HEAT SINK SOLDERED TO THE INTERNAL HEAT SINK

(75) Inventors: Roberto Tiziani, Nerviano; Roberto Rossi; Claudio Maria Villa, both of Villasanta, all of (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/211,426

(22) Filed: Dec. 15, 1998

(30) Foreign Application Priority Data

Dec. 16, 1997 (EP) .................................................. 97830677

(51) Int. Cl.$^7$ ...................................................... H05K 7/20
(52) U.S. Cl. ........................... 361/704; 361/704; 361/705; 361/707; 361/709; 257/706; 257/712; 257/717; 257/718; 165/80.2; 165/80.3; 174/16.3; 174/52.4
(58) Field of Search ................................... 361/702–710, 361/714, 717, 719, 722, 718, 687, 697, 688; 257/706–727, 796, 627, 737, 738, 741, 788, 789, 617, 773; 174/16.3, 52.4, 252.4; 165/80.2, 80.3, 165, 185

(56) References Cited

U.S. PATENT DOCUMENTS

| | | |
|---|---|---|
| 4,340,902 | 7/1982 | Honda et al. . |
| 4,914,551 * | 4/1990 | Anschel et al. ........................ 361/389 |
| 4,924,352 | 5/1990 | Septfons . |
| 5,216,283 * | 6/1993 | Lin ........................................ 257/787 |
| 5,272,599 | 12/1993 | Koenen . |

OTHER PUBLICATIONS

Patent Abstracts of Japan, vol. 006, No. 211, Oct. 23, 1982, and JP 57 117263 A (Mitsubishi Denki KK), Jul. 21, 1982.
Patent Abstracts of Japan, vol. 011, No. 292, Sep. 19, 1987, and JP 62 092347 A (Mitsubishi Electric Corp.), Apr. 27, 1987.
Patent Abstracts of Japan, vol. 008, No. 139, Jun. 28, 1984, and JP 59 047750 A (Hitachi Seisakusho KK), Mar. 17, 1984.
Patent Abstracts of Japan, vol. 018, No. 299, Jun. 8, 1994, and JP 06 061635 A (Rohm Co Ltd), Mar. 4, 1994.
G.L. Bond et al., "Wrap–Around Heat Sink," IBM Technical Disclosure Bulletin, vol. 20, No. 4, Sep. 1977, pp. 1434–1435.
"Technique for Heat–Sinking to Lower K," IBM Technical Disclosure Bulletin, vol. 4, No. 10, Mar. 1962, p. 53.

* cited by examiner

Primary Examiner—Leo P. Picard
Assistant Examiner—Michael Datskovsky
(74) Attorney, Agent, or Firm—Theodore E. Galanthay; Allen, Dyer, Doppelt, Milbrath & Gilchrist, P.A.

(57) ABSTRACT

An external heat sink is soldered to an internal heat sink incorporated into the bottom of a molded body of encapsulating resin for a package of an integrated power device. The power device is for surface mounting on a printed circuit board. The internal heat sink has at least a portion protruding from an outer surface of at least one face of the molded body. An external heat sink is mounted on the printed circuit board. The external heat sink has at least a surface abutting with a surface of the body, thus defining a separation gap between at least a surface of the protruding portion of the internal heat sink and an opposing surface of the external heat sink. This separation gap is filled with molten solder alloy during a normal soldering treatment of the printed circuit board.

22 Claims, 4 Drawing Sheets

CARD ASSEMBLY OF POWER DEVICE IN PLASTIC PACKAGE WITH EXTERNAL HEAT SINK SOLDERED TO THE INTERNAL HEAT SINK

FIELD OF THE INVENTION

The present invention relates to the field of heat sinks, and, more particularly, to a technique of dissipating heat generated inside a surface mounted integrated power device for a printed circuit board.

BACKGROUND OF THE INVENTION

A problem of dissipating heat generated within an integrated circuit and of maintaining an internal temperature of a package below a maximum tolerable value is particularly relevant when assembling power device packages on the surface of a printed circuit board. Such power device packages are typically formed from a plastic material. These power device packages include a body of resin that partially encapsulates a metal heat sink which acts as an internal heat sink. The metal heat sink is usually made of copper.

A silicon chip or die of an integrated circuit is mounted on the surface of the internal heat sink. According to a typical geometry of many of these power device packages, the presence of the metal heat sink on a bottom face of the integrated device makes it impossible to install an external heat sink that simply rests on the device when mounted on the printed circuit board because of the relatively poor thermal coupling formed.

To increase heat dissipation during operation, several approaches are known. A first approach is to pattern a copper pad on the printed circuit board onto which the internal heat sink of the power device package is soldered. In this manner, the heat generated inside the device may be effectively transferred through the copper pad. Accordingly, the heat is spread out over the printed circuit board.

Often, a plurality of holes are formed within the copper pad. These holes have their inner wall covered with a film of copper, and comprise as many conductive vias as necessary for transferring heat across the thickness of the board to the other side where another dedicated copper pad may be patterned. On the copper pad, an external metal sink may be placed or contact is made by the metal chassis of the apparatus.

According to a similar approach, the metal coated holes do not cross the entire thickness of the board, but reach a ground metallization layer sandwiched therein. The ground metalization layer is typically in the form of a copper film, which disperses the heat throughout the board. Yet another approach includes using printed circuit boards specially formed on a relatively thick metal substrate of a thermally conductive material, such as aluminum.

All of these approaches imply the use of specially configured printed circuit boards, or the use of printed circuit boards having special composite structures for heat dissipation. Therefore, these known approaches are rather costly, and often require special printed circuit boards that may not be compatible with a particular manufacturer's requirements.

SUMMARY OF THE INVENTION

An external metal heat sink may be installed on a power device to be assembled on a printed circuit board. The external metal heat sink may be soldered to an internal heat sink of the power device despite being customarily located on a bottom side of the device, i.e., slug down. The bottom side of the device is surface mounted on the printed circuit board.

Therefore, according to the invention, it is possible to place an external heat sink over the power device and solder it to the internal heat sink of the package during normal soldering operations. This is applicable to all devices and components installed on the printed circuit board that have a normal structure. A normal structure is one that does not have specially designed characteristics, other than having an internal metal heat sink placed at the bottom of the package for dissipating the heat generated in the power device. The internal metal heat sink placed at the bottom of the package is on the assembling side, i.e., slug down.

The invention applies to any power device where the internal metal heat sink or slug of the power device package has at least a portion projecting out of a surface of at least one side of the package. The package is commonly a molded body of encapsulating resin. An external metal heat sink has a shape suited to couple with a particular package of the power device, and has at least one surface abutting the package. The at least one surface of the external heat sink leaves a gap between the protruding part of the internal metal heat sink incorporated in the package and a surface of the external metal heat sink spacingly opposed to it. The power device is for surface-mounting on a printed circuit board. The gap is readily filled by molten eutectic tin/lead alloy during a normal soldering step of the devices and components installed on the printed circuit board.

According to a first embodiment of the invention, the internal metal heat sink has a portion that extends from a plane of the bottom encapsulating resin body of the power device package. The external metal heat sink has a base that is substantially shaped as a flat frame. Dimensions of the flat frame correspond with the package dimensions so that the protruding part of the internal metal heat sink of the package remains contained in an aperture of a bottom frame portion of the external heat sink. The sides of the frame portion abut the recessed perimeter part of the bottom of the molded body of encapsulating resin of the package that surrounds the protruding part of the internal metal heat sink.

In this manner, a gap remains between the outer perimeter surface of the internal metal heat sink and the inner perimeter surface of the bottom flat frame of the external metal heat sink. This gap may be filled at least partially by the molten soldering eutectic alloy of a patterned layer of soldering paste. The patterned layer of soldering paste is preventively applied on the assembly areas of the devices and components. Upon solidification of the solder alloy between the inner perimeter of the projecting part of the internal metal heat sink of the package and the inner surface of the aperture of the flat frame of the external metal heat sink, an effective thermally conducting bridge is formed. The thermally conducting bridge favors heat transfer from the internal metal heat sink to the external heat sink.

According to an alternative embodiment of the invention, the internal heat sink protrudes from two opposed sides of the molded body of resin of the power device package. The bottom of one of the sides rests on the patterned layer of soldering paste defined on the component assembly side of the board. The external metal heat sink is shaped to be placed over the power device. The external metal heat sink has two legs that extend toward the surface of the printed circuit board along the above mentioned sides of the package. The two legs rest on the printed layer of soldering paste, thus defining a gap between each laterally extending part of the internal metal heat sink and the inner face side of the relative vertical legs of the external metal sink opposed to it. The small vertical gap is at least partially filled by liquefied eutectic alloy during the soldering phase. This permanently solders each of the two laterally protruding parts of the internal metal heat sink to the opposed legs of the external heat sink placed over the device.

BRIEF DESCRIPTION OF THE DRAWINGS

The various aspects and advantages of the invention will become even clearer through the following description of several embodiments and by referring to the annexed drawings, wherein:

FIG. 8b is an enlarged detail view of FIG. 8a;

FIG. 9 is a perspective view of an external metal heat sink for mounting on the device of FIG. 8a.

DETAILED DESCRIPTION OF THE PREFERRED EMBODIMENTS

Figure 1:
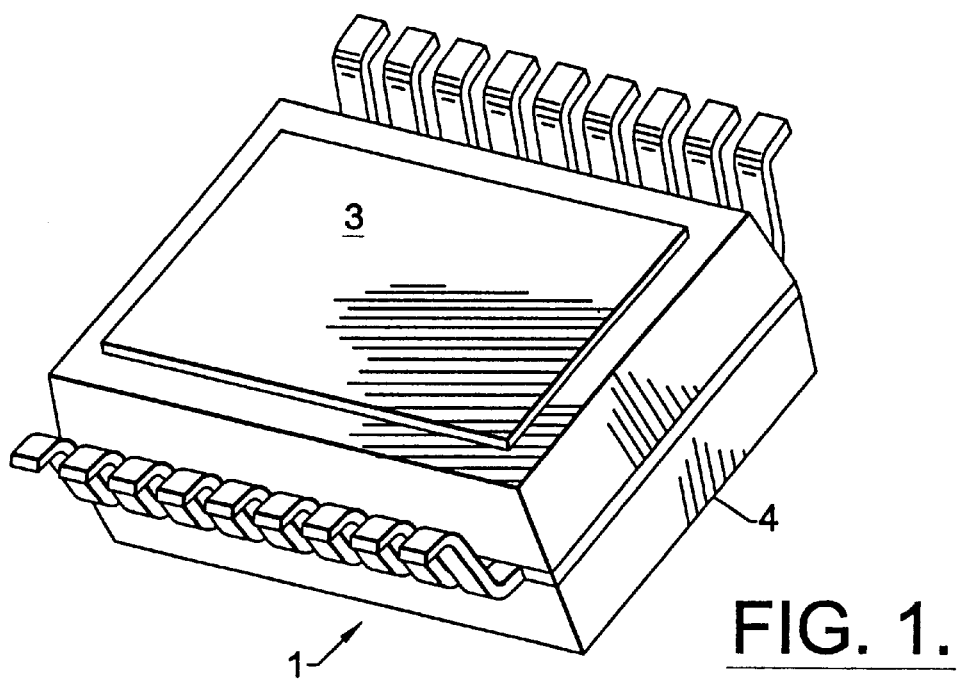
FIG. 1 is a perspective view of a power device with an internal metal slug protruding from the bottom side of the molded body of encapsulating resin, according to the present invention.

FIGS. 1 to 7 refer to a first embodiment of the invention. In these figures, the same parts and features are identified with the same reference numbers. An essential requirement for a power package device 1 to be provided with an external metal heat sink 2, according to the invention, is that an internal metal heat sink or slug 3 is only partially buried in the molded body 4 of the encapsulating resin. The internal metal heat sink 3 protrudes a certain height from the bottom face of the power package device 1. The power package device 1 is commonly configured for surface-assembly on a printed circuit board 7. The internal metal heat sink 3 is commonly made of a highly conducting metal, such as copper or nickel coated copper. A silicon chip or die of an integrated circuit is bonded onto the internal metal heat sink 3.

Figure 2:
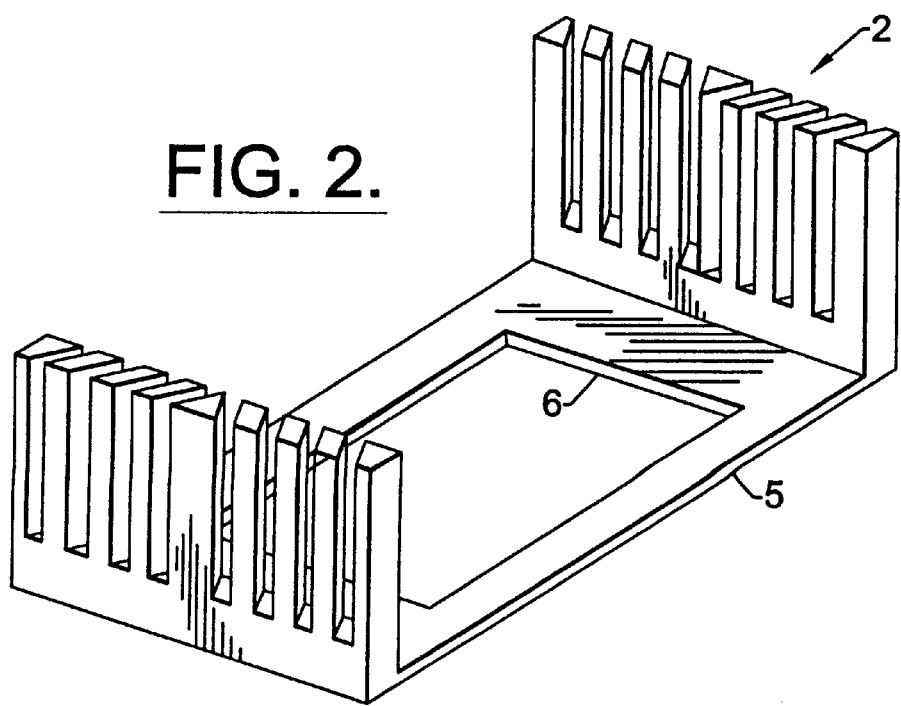
FIG. 2 is a perspective view of an external metal heat sink designed for coupling with the device of FIG. 1.
Figure 3:
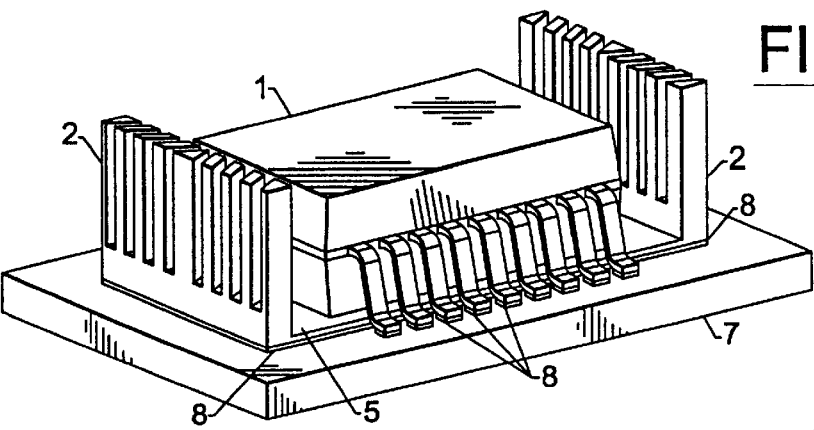
FIGS. 3 to 7 are full, detail and sectional views of an assembly made according to the present invention.
Figure 4:
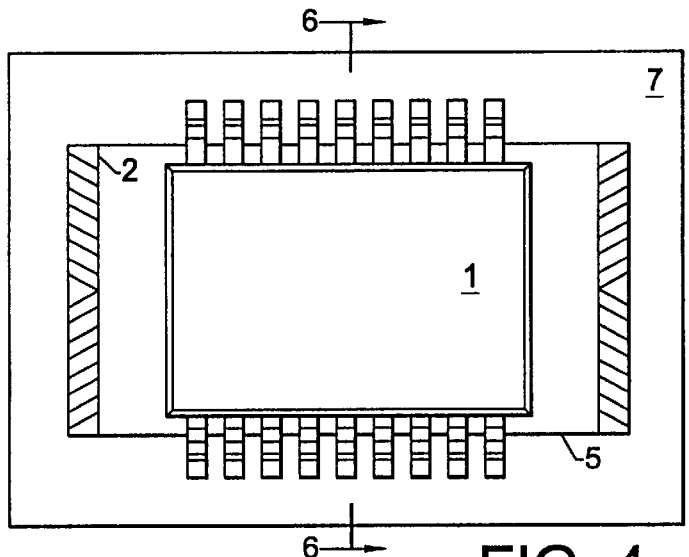
Figure 6:
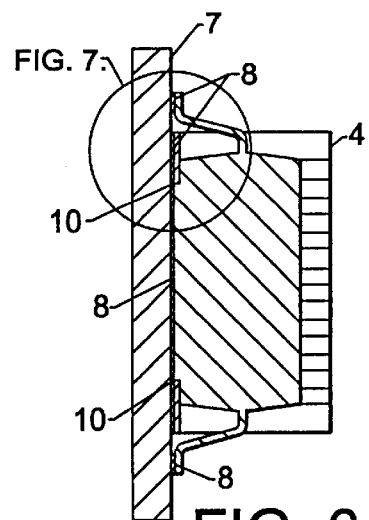
Figure 5:
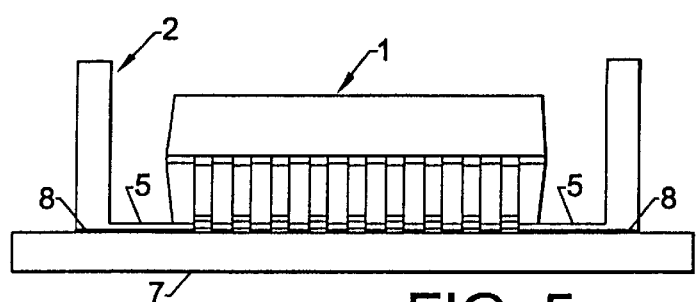
Figure 7:
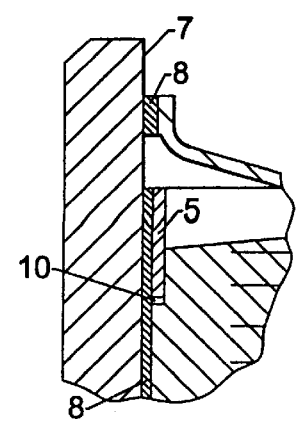
Figure 8A:
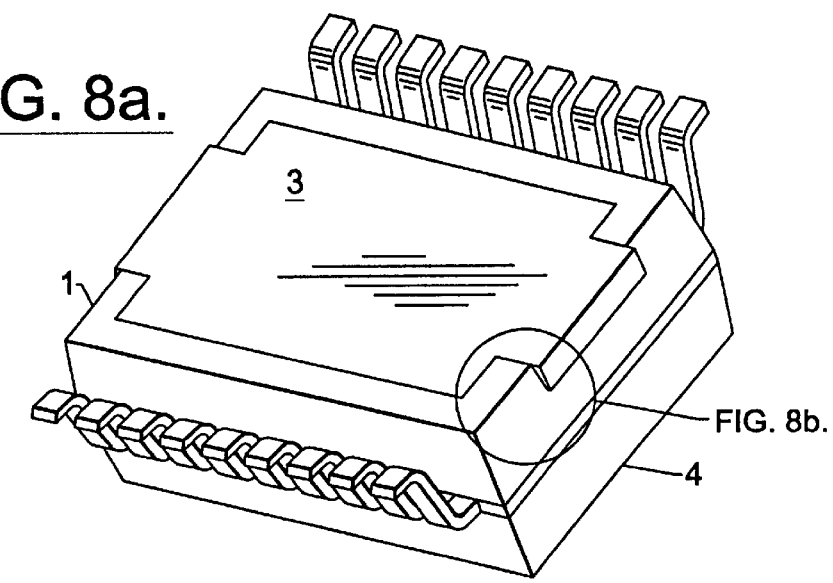
FIG. 8a is a perspective view of a power package formed according to a different embodiment of the present invention.
Figure 8B:
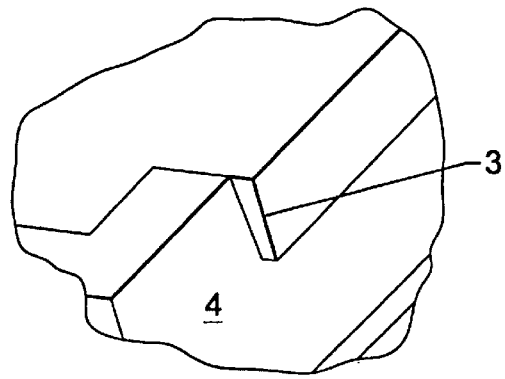

As shown in FIG. 2, the external metal heat sink 2 has a substantially flat base shaped as a rectangular frame 5. The dimensions of the central aperture 6 of the frame correspond with the dimensions of the protruding portion of the internal metal heat sink 3 of the power package device 1. The dimensions of the aperture 6 thus accommodate such a protruding portion into the aperture 6.

FIGS. 3 to 7 are full, detail and sectional views of an assembly made according to the present invention. The power package device 1 is positioned on the printed circuit board 7 after having positioned thereon the external metal heat sink 2. This is done so that the recessed perimeter part of the bottom side surrounding the protruding internal metal heat sink 3 may rest on the four sides of the flat frame 5. A thickness of the flat frame 5 may be approximately identical to the height of the protruding part of the internal metal heat sink 3 protruding out of the bottom side of the molded resin body 4. The external metal heat sink 2 and the internal metal heat sink 3 may both rest on the patterned layer of soldering paste 8 that is screen printed on the surface of the printed circuit board 7. During the soldering step, molten eutectic alloy 8 tends to fill at least partially the gap 10. The molten eutectic alloy 8 solders the internal metal heat sink 3 to the flat frame 5 of the external metal heat sink 2.

Figure 9:
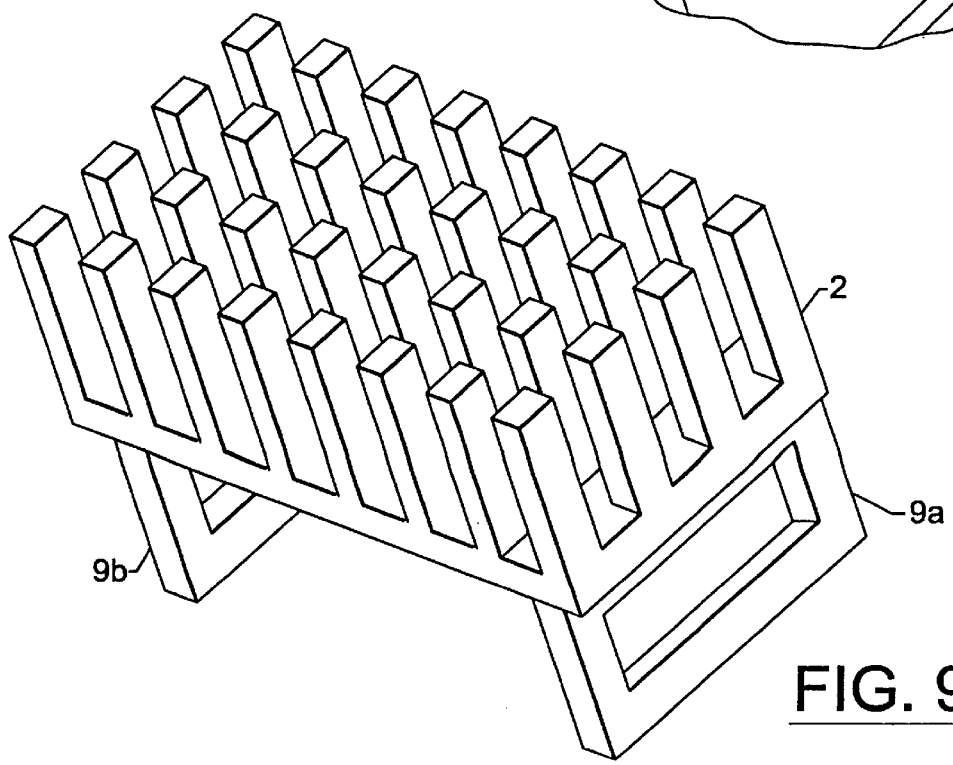
Figure 10:
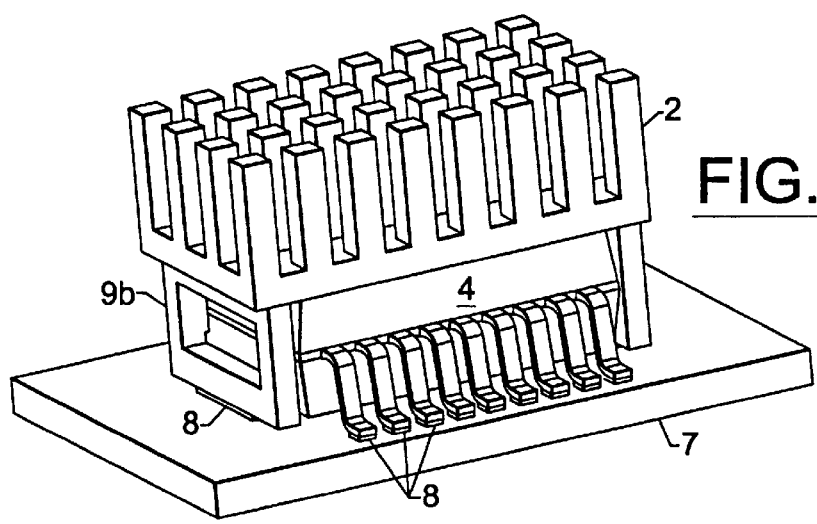
FIGS. 10 to 13 are full, detail and sectional views of an assembly made according to the present invention.
Figure 11:
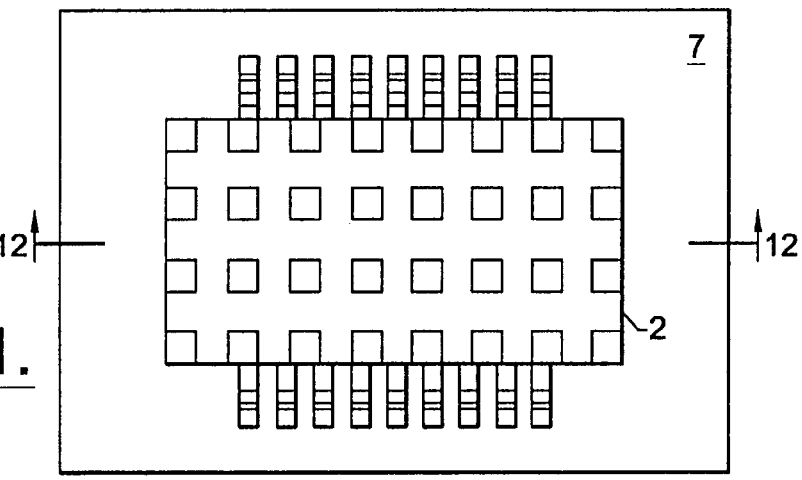

An alternative embodiment of the invention is illustrated in FIGS. 8a to 13. According to this alternative embodiment, the internal metal heat sink 3 protrudes laterally out of two opposed sides of the encapsulating resin body 4 of the power package device 1. In this case, the specifically designed external metal heat sink 2, as shown in FIG. 9, has two lateral legs or wings 9a, 9b that extend towards the surface of the printed circuit board 7. The external metal heat sink 2 is to be mounted on the power package device 1. The ends of the two lateral legs 9a, 9b rest on the patterned layer of solder paste that is preventively screen printed on the face of the printed circuit board 7, according to common techniques that are well known to one skilled in the art.

Figure 12:
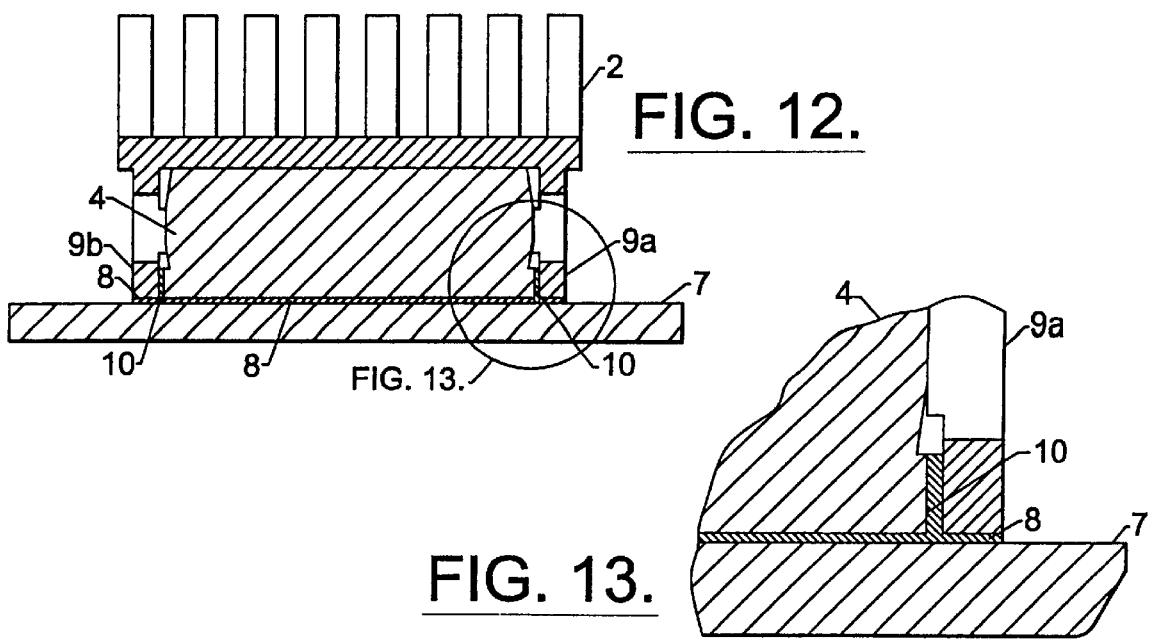
Figure 13:
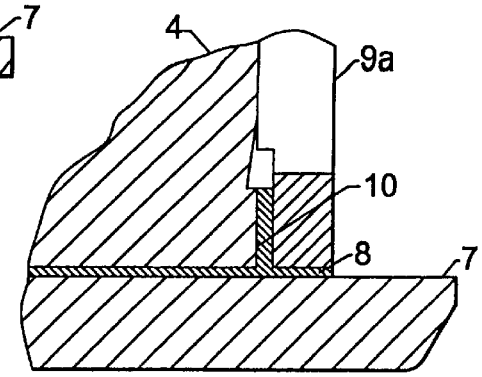

As shown in FIGS. 12 and 13 (FIG. 13 is an enlarged sectional view), the gap 10 between each laterally protruding part of the internal metal heat sink 3 and the opposed inner surface of the respective legs (9a, 9b) of the external metal heat sink 2 are filled by molten solder alloy during the heat treatment for melting the soldering paste 8. This eventually solders the two parts together and establishes an effective heat conducting path from the internal metal heat sink 3 to the external metal heat sink 2 placed on the power package device 1.

The system of the invention permits different assemblies to be formed that include an external metal heat sink mounted on power devices that are surface mounted on a printed circuit board, notwithstanding the fact that the power devices comprise a slug-down type.

What is claimed is:

1. An assembly of a power device surface mounted on a printed circuit board, the assembly comprising:

an integrated circuit mounted on the printed circuit board and comprising a body of encapsulating material and an internal heat sink connected thereto, said internal heat sink comprising at least one protruding portion extending outwardly beyond adjacent portions of said body of encapsulating material; and an external heat sink mounted on the printed circuit board and having a surface portion abutting said body of encapsulating material and defining a separation gap between the at least one protruding portion of said internal heat sink and an opposing portion of said external heat sink, the separation gap containing solder therein.

2. An assembly according to claim 1, wherein the at least one protruding portion of said internal heat sink protrudes from a bottom portion of said body of encapsulating material toward the printed circuit board to define a recessed perimeter portion around said internal heat sink; and wherein said external heat sink comprises a substantially flat frame having an opening receiving therein the at least one protruding portion of said internal heat sink, over which rests the recessed perimeter portion of said body of encapsulating material, and defining the separation gap between opposing perimeter surfaces of the at least one protruding portion of said internal heat sink and the opening of the substantially flat frame.

3. An integrated power device according to claim 1, wherein the at least one protruding portion of said internal heat sink protrudes from two opposite lateral sides of said body of encapsulating material; and wherein said external heat sink comprises two legs extending towards a surface of the printed circuit board along the two lateral sides of said body of encapsulating material, and defining the separation gap between each protruding portion of said internal heat sink and an inner surface of the respective opposing leg.

4. An integrated power device according to claim 1, wherein said internal and external heat sinks each comprises metal.

5. An integrated power device according to claim 1, wherein said internal heat sink comprises a slug.

6. An integrated power device according to claim 1, wherein said body of encapsulating material comprises resin.

7. An integrated power device according to claim 1, wherein said integrated circuit comprises pins.

8. An integrated power device according to claim 2, wherein a thickness of said substantially flat frame is substantially equal to a height of the at least one protruding portion of said internal heat sink.

9. An assembly of a power device surface mounted on a printed circuit board, the assembly comprising:
   an integrated circuit mounted on the printed circuit board and comprising a body of encapsulating material and an internal heat sink connected thereto, said internal heat sink comprising at least one exposed portion exposed from said body of encapsulating material; and
   an external heat sink mounted on the printed circuit board and having a surface portion defining a separation gap with the at least one exposed portion of said internal heat sink, the separation gap for receiving solder therein.

10. An assembly according to claim 9, wherein the at least one exposed portion of said internal heat sink protrudes from a bottom portion of said body of encapsulating material toward the printed circuit board to define a recessed perimeter portion around said internal heat sink; and wherein said external heat sink comprises a substantially flat frame having an opening receiving therein the at least one exposed portion of said internal heat sink, over which rests the recessed perimeter portion of said body of encapsulating material, and defining the separation gap between opposing perimeter surfaces of the at least one exposed portion of said internal heat sink and the opening of the substantially flat frame.

11. An integrated power device according to claim 9, wherein the at least one exposed portion of said internal heat sink protrudes from two opposite lateral sides of said body of encapsulating material; and wherein said external heat sink comprises two legs extending towards a surface of the printed circuit board along the two lateral sides of said body of encapsulating material, and defining the separation gap between each exposed portion of said internal heat sink and an inner surface of the respective opposing leg.

12. An integrated power device according to claim 9, wherein said internal and external heat sinks each comprises metal.

13. An integrated power device according to claim 9, wherein said internal heat sink comprises a slug.

14. An integrated power device according to claim 9, wherein said body of encapsulating material comprises resin.

15. An integrated power device according to claim 9, wherein said integrated circuit comprises pins.

16. An integrated power device according to claim 10, wherein a thickness of said substantially flat frame is substantially equal to a height of the at least one exposed portion of said internal heat sink.

17. A method of dissipating heat from a surface mounted integrated power device, the method comprising the steps of:
   mounting the surface mounted integrated power device on a printed circuit board, the surface mounted integrated power device comprising a body of encapsulating material and an internal heat sink connected thereto, the internal heat sink comprising at least one exposed portion extending outwardly beyond adjacent portions of the body of encapsulating material;
   mounting an external heat sink on the printed circuit board;
   defining a separation gap between the at least one exposed portion of the internal heat sink and an opposing portion of the external heat sink; and
   filling the separation gap with a body of soldering material.

18. A method according to claim 17, further comprising the steps of mounting the surface mounted integrated power device and the external heat sink on a patterned layer of soldering paste.

19. A method according to claim 17, further comprising the step of inserting the at least one exposed portion of the internal heat sink into an opening of the external heat sink.

20. A method according to claim 19, wherein the external heat sink comprises a substantially flat frame having an opening therein; and wherein the step of defining a separation gap is defined between opposing perimeter surfaces of the at least one exposed portion of the internal heat sink and the opening of the substantially flat frame.

21. A method according to claim 20, wherein the substantially flat frame has a thickness substantially equal to a height of the at least one exposed portion of the internal heat sink.

22. A method according to claim 17, wherein the at least one exposed portion of the internal heat sink protrudes from two opposite lateral sides of the body of encapsulating material, and the external heat sink comprises two legs extending towards a surface of the printed circuit board along the two lateral sides of the body of encapsulating material; wherein the step of defining the separation gap is defined between each exposed portion of the internal heat sink and an inner surface of the respective opposing leg.

* * * * *